United States Patent
Zhu et al.

(10) Patent No.: US 8,594,264 B1
(45) Date of Patent: Nov. 26, 2013

(54) PHASE DETECTION AND ALIGNED SIGNAL SELECTION WITH MULTIPLE PHASES OF CLOCKS

(75) Inventors: Xiang Zhu, San Jose, CA (US); Greg W. Starr, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 482 days.

(21) Appl. No.: 12/967,489

(22) Filed: Dec. 14, 2010

(51) Int. Cl.
*H04L 7/00* (2006.01)

(52) U.S. Cl.
USPC .......................................... 375/371; 327/149

(58) Field of Classification Search
USPC .......... 375/354, 371, 373; 327/149, 141, 147, 327/144, 146
See application file for complete search history.

(56) References Cited

U.S. PATENT DOCUMENTS

| | | | | |
|---|---|---|---|---|
| 6,621,861 | B1 * | 9/2003 | Shen | 375/226 |
| 7,644,296 | B1 * | 1/2010 | Burney | 713/401 |
| 2002/0006177 | A1 * | 1/2002 | Pickering et al. | 375/371 |
| 2008/0263381 | A1 * | 10/2008 | Khor et al. | 713/500 |
| 2010/0115381 | A1 * | 5/2010 | Truong et al. | 714/782 |
| 2012/0027141 | A1 * | 2/2012 | Petrovic et al. | 375/350 |

* cited by examiner

*Primary Examiner* — Kevin M Burd
(74) *Attorney, Agent, or Firm* — Julie Mar-Spinola; LeRoy D. Maunu (57) ABSTRACT

Alignment of a clock signal to a particular phase is described. In one aspect, a method includes receiving an incoming clock signal and multiple phased clock signals, each of the phased clock signals having a different phase and a substantially same phase offset from another phased clock signal. At least one detection signal based on the incoming and phased clock signals is provided, and one or more errors contributed by noise in at least the incoming clock signal are corrected in the at least one detection signal. Based on the at least one detection signal, one of the phased clock signals is selected as the most closely aligned of the phased clock signals to the predetermined clock phase, and the selected clock signal is output.

15 Claims, 7 Drawing Sheets

PHASE DETECTION AND ALIGNED SIGNAL SELECTION WITH MULTIPLE PHASES OF CLOCKS

FIELD OF THE INVENTION

The present invention relates generally to circuits providing phase alignment of signals, and more specifically to phase detection and aligned clock signal selection using multiple phases of clocks.

BACKGROUND

Phase frequency detectors (PFDs), phase locked loops (PLLs), and delay locked loops (DLLs) are used extensively in electronic circuits for a variety of functions related to signal communications. One function used in many communication systems includes clock and data recovery (CDR). Data transmissions may be sent to a receiver from a transmitter. The receiver can recover a clock signal from a received data signal, and then align the phase of a local receiver clock with the phase of the recovered clock signal. In some systems, a PLL or DLL can be used to perform clock phase alignment.

The phase detection circuits used in PLLs, DLLs, and other components are typically implemented by comparing the rising edges of two signals and generating a phase difference signal that is provided to further blocks in the system. These additional blocks may shift the phase of the local clock signal in accordance with the phase difference signal to align the phases of the signals. Some implementations provide multiple clock signals having different phases, where one of the clock signals is selected as being most closely aligned with the incoming signal.

However, in some implementations, the detection of the phase difference for the selection of an aligned signal is performed only once in order to reduce processing time. This can result in inaccuracies in the alignment of phases between the signals, if any noise or interference exists in the incoming signal. Noise or interference, such as jitter, in a digital transmission may make clock phase alignment more difficult. For example, jitter can include random and intermittent variations in a signal, such as phase shifts, that occur during transmission or from other sources.

Accordingly, apparatus and methods that accurately provide a signal having a phase aligned with an incoming clock or other particular phase, without significantly increasing processing time, would be desirable in many applications.

SUMMARY

Disclosed embodiments relate to phase detection and aligned clock signal selection using multiple phases of clocks. Embodiments described herein utilize an error correction method that can reduce inaccurate detection of phase differences in a noisy environment, and/or a self-calibration mechanism that can compensate for process, voltage, and temperature variations in an alignment circuit.

In one aspect, a method is disclosed for providing an output clock signal aligned with a particular clock phase using one or more circuits. The method includes receiving an incoming clock signal and a plurality of generated phased clock signals, each of the phased clock signals having a different phase and about a same phase offset from one other of the phased clock signals. At least one detection signal based on the incoming clock signal and the phased clock signals is provided, and one or more errors contributed by noise in at least the incoming clock signal are corrected in the at least one detection signal. Based on the at least one detection signal, one of the phased clock signals is selected as the most closely aligned of the phased clock signals to the predetermined clock phase, and the selected phased clock signal is output as the aligned output clock signal.

In another aspect, another method is disclosed for providing an output clock signal aligned with a particular clock phase using one or more circuits. The method includes receiving the incoming clock signal and a plurality of generated phased clock signals, each of the phased clock signals having a different phase and about a same phase offset from one other of the phased clock signals. The signal paths of the incoming clock signal and the phased clock signals are calibrated by adjusting a delay in the signal path of the incoming clock signal such that the incoming clock signal arrives at the detection circuit at substantially the same time as each of the phased clock signals. One of the phased clock signals that has a phase closest to the particular clock phase is selected, and the selected phased clock signal is output as the aligned output clock signal.

In another aspect, a clock alignment circuit includes a detection circuit receiving an incoming clock signal and a plurality of generated phased clock signals, each of the phased clock signals having a different phase and about a same phase offset from one other of the phased clock signals. The detection circuit provides at least one detection signal based on the incoming clock signal and the phased clock signals. Selection logic receives the at least one detection signal from the detection circuit, the selection logic correcting one or more errors in the at least one detection signal contributed by noise in at least the incoming clock signal. Based on the at least one detection signal, the selection logic selects one of the phased clock signals as the most closely aligned of the phased clock signals to a particular clock phase. The selected phased clock signal is output as an aligned output clock signal.

BRIEF DESCRIPTION OF THE FIGURES

FIG. 4-1 is a schematic diagram of one embodiment of a detection circuit of the detection and capture block shown in FIG. 3;

FIG. 4-2 is a schematic diagram of one embodiment of a capture circuit of the detection and capture block shown in FIG. 3;

FIG. 4-3 is a schematic diagram of one embodiment of the error correction block and the aligned phase selection block of FIG. 3;

FIGS. 6-1 and 6-2 are diagrammatic illustrations of example embodiments of error correction in the detection signals from the detection circuit and selection of a phased clock signal that is aligned with the incoming clock signal;

DETAILED DESCRIPTION

The present invention relates generally to circuits providing phase alignment of signals, and more specifically to phase detection and aligned clock signal selection using multiple phases of clocks. The following description is presented to enable one of ordinary skill in the art to make and use the invention, and is provided in the context of a patent application and its requirements. Various modifications to the disclosed embodiments and the generic principles and features described herein will be readily apparent to those skilled in the art. Thus, the present invention is not intended to be limited to the embodiment shown, but is to be accorded the widest scope consistent with the principles and features described herein.

Embodiments described herein include a circuit structure with error correction and self-calibration for phase detection and aligned signal selection from multiple phases of a clock signal. This circuit structure can be used in many phase alignment application structures. The selected clock signal can be selected based on having an aligned phase with an incoming clock signal. In other embodiments, the selected output clock signal can be selected based on being aligned with other particular or predetermined output clock requirements, such as being delayed to a particular phase offset from the incoming clock. In one embodiment, such a desired delay can be provided by generating the multiple phases of signal through a delay chain.

For example, error in the clock signal(s) can be contributed by noise including jitter, signal distortion, and interference, leading to phase detection inaccuracies which can be reduced or avoided by the error correction techniques described herein. Process, temperature, and voltage variations can lead to unsynchronized clock signals used in phase detection, which can be reduced or avoided with the calibration techniques described herein.

To more particularly describe the features of the present invention, please refer to FIGS. 1-8 in conjunction with the discussion below.

Figure 1:
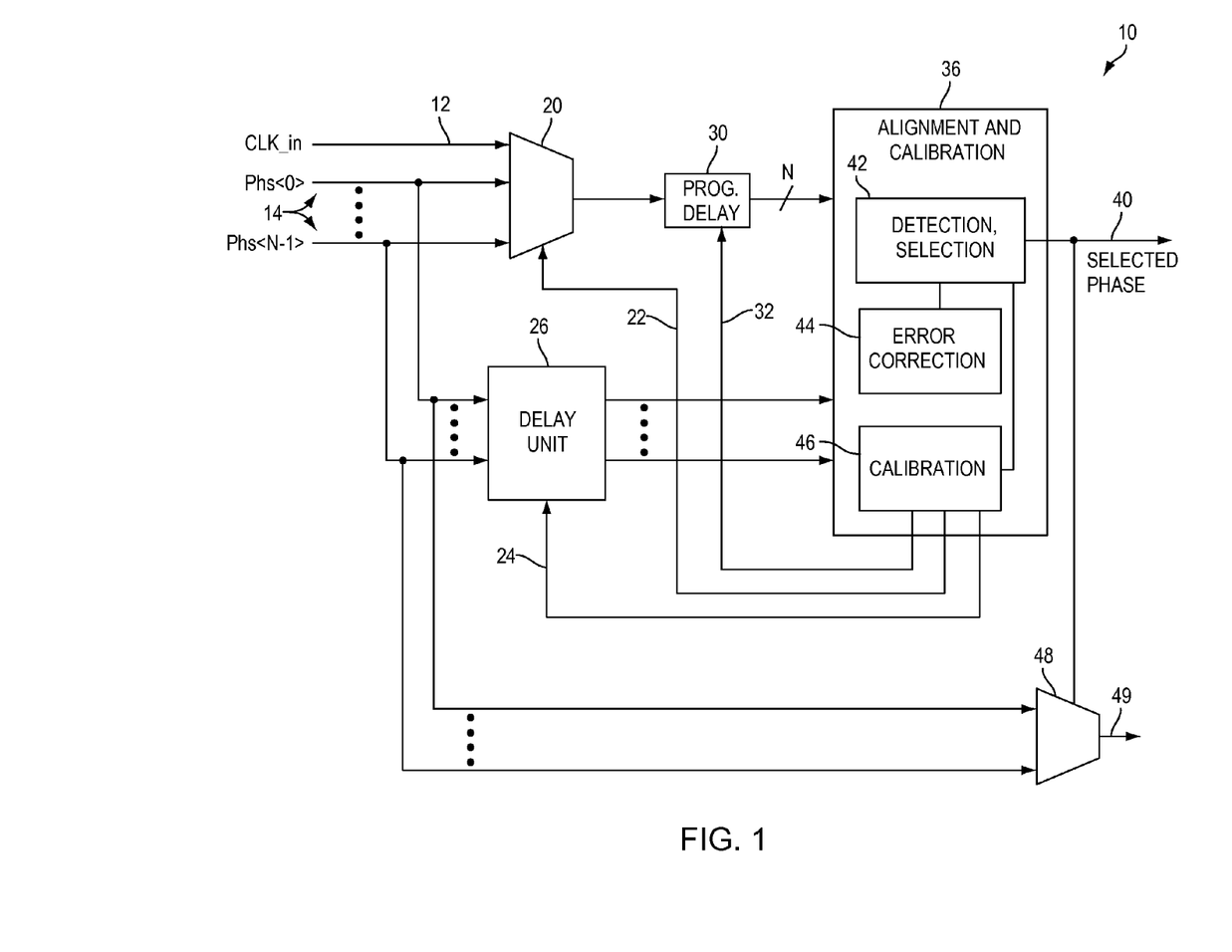
FIG. 1 is a block diagram of one embodiment of a phase alignment circuit for use with the present embodiments described herein.

FIG. 1 is a block diagram of one embodiment of a phase alignment circuit 10 for use with the present embodiments described herein. In some embodiments, circuit 10 can be included in a receiver that receives a data signal from a transmitter. For example, a receiver end in a SerDes (serializer/deserializer) (e.g., in a Field Programmable Gate Array (FPGA) or other processing circuit, programmable device, or other type of circuit or device) may receive a serial digital data stream over a communication channel and convert the serial data to parallel data to be used by other components in a system at the receiver end. Many other types of applications and circuits can also use the signal phase alignment and/or calibration features described herein.

Phase alignment circuit 10 receives an incoming clock signal (CLK_in) 12. For example, this signal can be a received clock signal to which the circuit 10 is to align a local clock signal. For example, clock signal 12 may be a recovered clock signal from a received data signal. The recovery of a clock signal from a received data signal can be performed, for example, by a clock and data recovery (CDR) block (not shown) that provides the incoming clock signal 12 to the circuit 10. In other embodiments, any clock signal can be treated as the incoming clock signal 12 to which another clock signal can be aligned.

Also provided to the phase alignment circuit 10 are a number of different-phase clock signals (or "phased clock signals") 14. The phased clock signals 14 are provided from a local stable source, such as a source at a receiver including the circuit 10. For example, a multiple-phase PLL (e.g., in a clock and data recovery block, not shown) can provide the phased clock signals 14.

Each clock signal 14 is offset in phase as referenced from a previous clock signal 14 in a sequential order of the signals 14, indicated in FIG. 1 by Phs<0> to Phs<N−1>, where N can be any number specific to an implementation. In some embodiments, N can be determined based on the bit width of a bus between the circuit 10 and another circuit or functional block at the receiver end. For example, in one embodiment, N can be half a bit width used for data such that, e.g., if a 20-bit data width is used in the system, then N can be 10.

Figure 2:
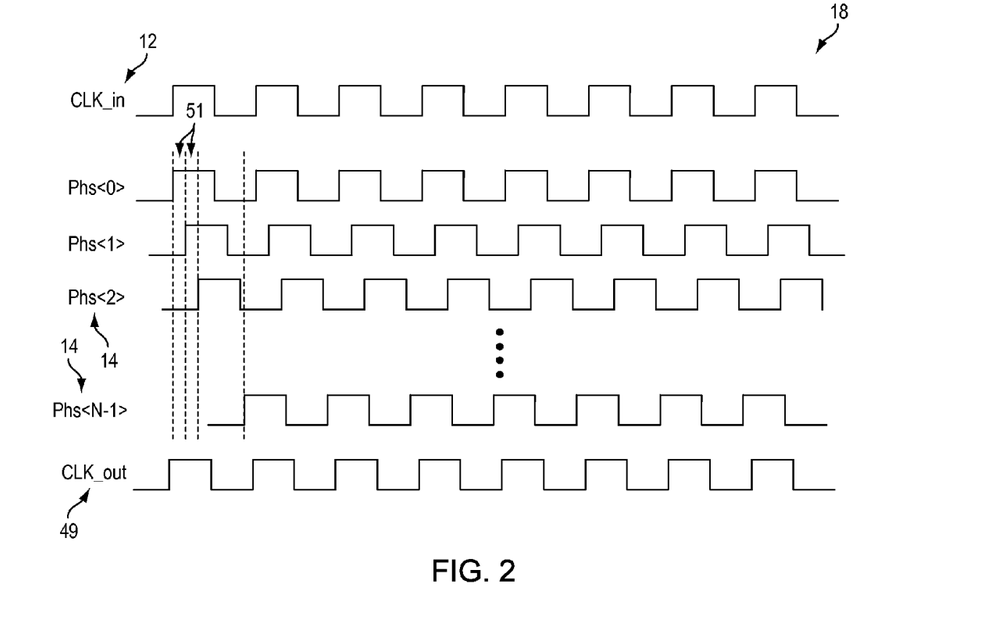
FIG. 2 is a diagram illustrating example timing of the phased clock signals and the incoming clock signal for use with the embodiments described herein.

FIG. 2 shows an example timing diagram 18 of the phased clock signals 14 and the incoming clock signal (CLK_in) 12. The phased clock signals 14 are provided in reference to a reference phased clock signal 14, which is the Phase 0 (Phs<0>) signal in the examples described herein. Clock signal Phs<1> has a rising edge that is offset from the rising edge of clock signal Phs<0> by a phase offset 51, while clock signal Phs<2> has a rising edge offset from signal Phs<1> by the same offset 51. The same offset 51 (or substantially the same offset) is provided for each successive clock signal 14 in the order shown relative to the previous clock signal, such that the same offset is provided between each two adjacent clock signals 14 in FIG. 2 (or about the same offset, i.e., as substantially close to constant offset as can be reasonably achieved). In some embodiments, the amount of the offset can be based on dividing the incoming clock period into even intervals. For example, the period of the incoming clock 12 can be divided by the number of clock signals 14 to obtain the offset. In some embodiments, e.g., in a high-frequency system, the offset can be based on the bit time in the system, e.g., 2 unit intervals (UIs), where a unit interval is 1 divided by the data rate.

The outgoing clock signal (CLK_out) 49 is the selected one of the phased clock signals 14 that is most aligned with the incoming clock signal 12, as determined by the circuit 10. This determination process is described in greater detail below.

Referring back to FIG. 1, the incoming clock signal 12 and the phased clock signals 14 are provided as inputs to a multiplexer 20 used for calibration of the clock signal paths. The multiplexer 20 has a selection signal 22 provided from the alignment and calibration block 36, which selects one of the input signals to be output from the multiplexer 20. As described below, if the circuit 10 is in a calibration mode, then one of the phased clock signals 14 is selected for output from the multiplexer. If the circuit 10 is in operation mode (phase detection and alignment), the selection signal 22 selects the incoming clock signal 12 to be output from the multiplexer 20.

The output of the multiplexer 20 is provided to a programmable delay block 30, which provides a delay to a clock signal 12 or 14 output from the multiplexer 20. This delay is used to calibrate the different incoming clock paths to components in the alignment and calibration block 36, as described in greater detail below. In the described embodiment, the programmable delay block 30 includes an independently-programmable delay for each signal path associated with a different phased clock signal 14, as described in greater detail below with respect to FIG. 7. The magnitudes of programmable delays are based on a control signal 32 input to the programmable delay block 30 and provided from the block 36. Control signal 32 determines the amount of delays needed, as discussed in greater detail below. For example, the programmable delay block 30 can include a number of inverters to delay the signal, or any other suitable circuit. The phased clock signals 14 provided via the multiplexer 20 for calibration are referred to herein as "calibration phased clock signals" or "multiplexer phased clock signals."

The phased clock signals 14 are also provided to a delay unit 26. The delay unit 26 is configured to delay the phased clock signals 14 by an amount of time matching the delay encountered by the clock signals in the multiplexer 20. The delay unit 26 can include any suitable circuit for delaying the clock signals. For example, in some embodiments the multiplexer 20 can include a number of transmission gates, and the delay unit 26 can include these same types and configuration of transmission gates in order to duplicate the delay in the multiplexer. The phased clock signals 14 through the delay unit 26 are all provided to the alignment and calibration block 36, to be used in both calibration mode and operation mode for clock alignment.

The alignment and calibration block 36 performs signal detection, capture, error correction, selection, and calibration. The block 36 receives from the programmable delay block 30 the incoming clock signal 12 during operation mode or one of the signals 14 during calibration mode, and also receives the phased clock signals 14 from the delay unit 26. The alignment and calibration block 36 includes a detection and selection block 42 that provides detection signals based on the incoming clock signal 12 and the phased clock signals 14, captures the detection signals, and selects the phased clock signal 14 that is closest to the incoming clock signal 12, based on the detection signals. The block 36 can also include an error correction block 44 for performing error correction on the detection signals, and/or a calibration block 46 for calibrating the clock signal paths to the block 36. In other embodiments, the functionality of block 36 can be organized in different blocks from the blocks 42, 44, and 46 shown in the example of FIG. 1.

Figure 41:
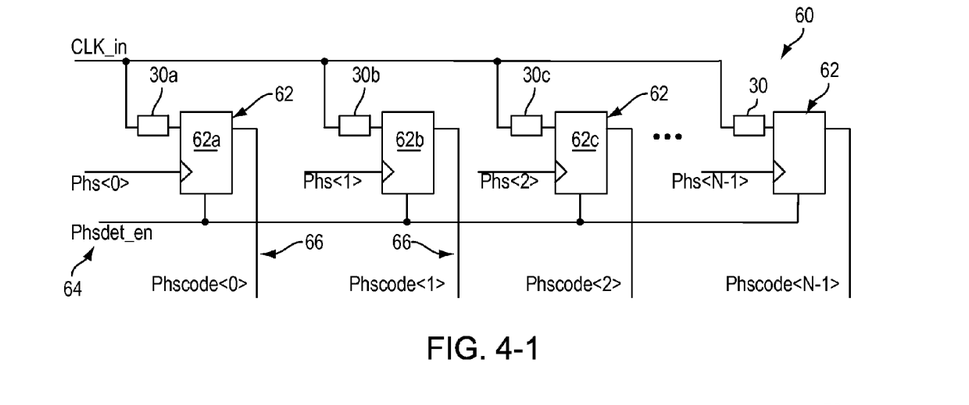

The calibration block 46 controls the programmable delay block 30 as well as the multiplexer 20 and delay unit 26, to calibrate the different pathways of the clock signals 12 and 14 to the alignment and calibration block 36 so that these pathways are synchronized and have no process, voltage, or temperature variations that would introduce error into clock signal alignment. The calibration block 46 provides a calibration selection signal on line (or bus) 22 to the multiplexer 20 to select one of the input clock signals 12 or 14 to be output from the multiplexer, and also provides a calibration adjustment signal 32 to the programmable delay block 30. The adjustment signal 32 is used during a calibration mode to set an appropriate delay in block 30 to each individual clock signal path in the multiplexer path to an associated flip-flop in block 36, as described in greater detail below with respect to FIGS. 4-1 and 7.

The detection and selection block 42 can detect the code representing the incoming clock signal 12 and can provide the detected code to the error correction block 44. The error correction block 44 performs validation and error correction for signals (e.g., a bit code) detected by the block 42, to allow accurate selection of the aligned phased clock signal 14 closest to the incoming clock. The error correction block can provide error-corrected signals (such as one or more bit codes) to block 42 to allow block 42 to perform the selection, or can otherwise provide signals to the block 42 to indicate how to correct the received signals. For example, the block 42 can select the phased clock signal 14 having a rising edge closest to the rising edge of incoming clock signal 12, or output a selection code which causes one or more other components to select this phased clock signal, as described in greater detail below.

Block 42 outputs a selection signal 40 indicating one of the phased clock signals as aligned with the incoming clock signal, and which can be used by the system connected to circuit 10. For example, this selection signal 40 can be received by a clock output circuit such as another multiplexer 48 (or other circuit) provided in the system, where the multiplexer 48 receives the phased clock signals 14 and selects one of the signals 14 to be output to the rest of the system as the aligned clock signal 49 based on the selection signal 40. In some embodiments, the phase of the selected clock signal 49 is aligned with the phase of incoming clock 12 to allow components at the receiver end to operate with timing properly coordinated with a transmitter and transmitted data. Other embodiments can align the output clock 49 to some other predetermined phase or timing requirements. In some embodiments, the alignment and calibration block 36 can include the clock output circuit (such as the multiplexer 48) and can output the selected outgoing aligned clock signal 49.

Some operations of the alignment and calibration block 36 are described in further detail below with respect to FIG. 3.

Figure 3:
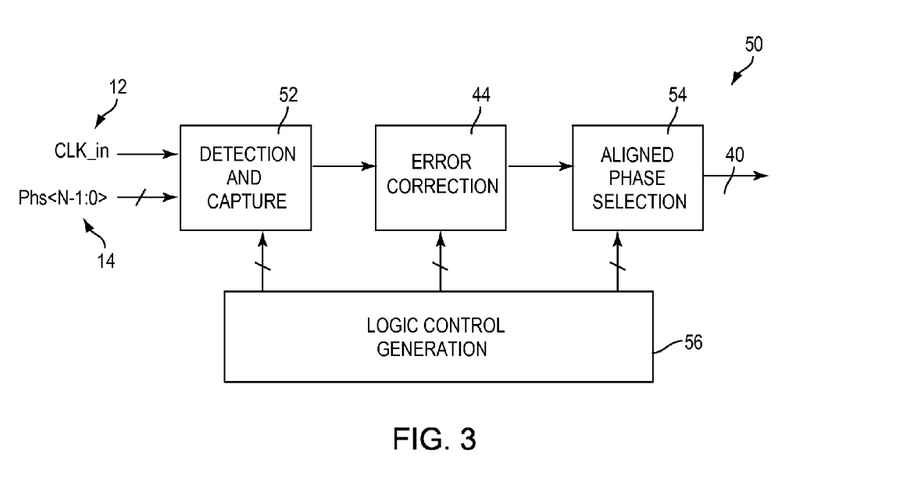
FIG. 3 is a block diagram illustrating one embodiment of a portion of the functionality of the alignment and calibration block shown in FIG. 1.

FIG. 3 is a block diagram illustrating one embodiment of a portion 50 of the functionality of the alignment and calibration block 36 shown in FIG. 1. The portion 50 of block 36 includes a phase code detection and capture block 52, error correction block 44, an aligned phase selection block 54, and a logic control generation block 56.

Figure 42:
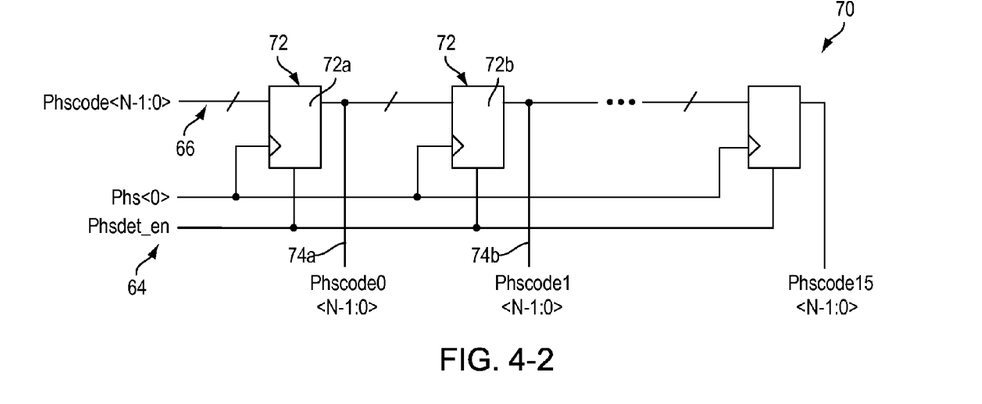

After the calibration of the clock signal paths, the selection of an aligned clock signal is performed. The phase code capture and detection block 52 receives the incoming clock 12 from the programmable delay block 30 and the phased clock signals 14 from the delay unit 26 (shown in FIG. 1). The detection and capture block 52 provides detection signals based on comparing the incoming clock signal 12 and each phased clock signal 14, such as bit code samples of the incoming clock 12 as clocked by each of the phased clock signals 14. Block 52 also captures multiple samples of these sampled bit codes. The captured samples can be captured, for example, using flip flops. One embodiment is described in greater detail with respect to FIGS. 4-1 and 4-2.

The error correction block 44 validates the sampled bit codes provided by the detection and capture block 52 and performs error correction on this information, as detailed below with respect to FIGS. 6-1 and 6-2. Block 44 provides the error corrected bit code(s) (and/or other information) to the aligned phase selection block 54. The block 54 selects the phased clock signal 14 that is the most closely aligned to the incoming clock 12, and outputs the selection signal 40 indicating the closest aligned clock signal. Selection signal 40 causes the selected phased clock signal 14 to be output as the aligned output clock signal, as described above with reference to FIG. 1. One embodiment of block 54 is described in greater detail with respect to FIG. 4-3. The logic control generation block 56 provides control signals for the three blocks 50, 52, and 54, such as enable signals as detailed in FIGS. 4-1-4-3. In addition, the logic block 56 can provide control signals such as an error correction signal to error correction block 44 that selects which error correction method(s) are to be used by block 44, as described in greater detail below.

FIG. 4-1 is a schematic diagram of a detection circuit 60 that can be included in the detection and capture block 52 shown in FIG. 3. The incoming clock signal 12 (CLK_in) is provided as the data (or D) input to a number of D flip-flops 62. For example, the number of flip-flops 62 can be equal to N, the number of phased clock signals 14, which in turn can be based on the number of bits used in the datapath of the system. Each incoming clock signal 12 path to a flip-flop 62 has its own associated programmed delay 30 for that path, such that the incoming clock signal 12 arrives at each flip-flop 62 calibrated with the associated phased clock signal 14. The calibration of the clock signal paths is described in greater detail below with respect to FIG. 7.

Each flip-flop 62 is provided with one of the phased clock signals 14 as its clock input. The phased clock signals 14 have been routed through a clock tree (not shown) that maintains phase differences between the signals before being provided to the clock input of each of the flip-flops 62. In addition, a phase detect enable signal (Phsdet_en) 64 is provided from the logic control generation block 56 to enable the output of each flip flop 62. Each of the flip-flops 62 provides a "Phscode" output detection signal 66. Thus, each flip-flop 62 uses its associated one of the multiple phased clock signals 14 to sample the incoming clock 12 and provide an associated detection signal bit 66, where that output bit is a 1 when the rising edge of the phased clock signal 14 is concurrent with a 1 level of the incoming clock 12, and the output bit is a 0 when the rising edge of the phased clock signal 14 is concurrent with a 0 level of the incoming clock 12. Collectively, the flip-flops 62 output a code including the detection signal bits 66 from each flip-flop provided in a sequence the same as the phased control signals 14, based on their phase offsets (Phscode<0> to Phscode<N−1> in the example shown).

FIG. 4-2 is a schematic diagram illustrating an example capture circuit 70 that can be included in the detection and capture block 52 shown in FIG. 3, in which multiple samples of the code comprising the detection signal bits output from the set of flip-flops 62 of FIG. 4-1 are captured. A number of D flip flops 72 are provided, the first flip-flop 72 having a data input receiving the sampled detection code 66 output from the D flip-flops 62 shown in FIG. 4-1. Each flip-flop 72 is provided with the same one of the phased clock signals 14 (e.g., Phs<0>) as its clock input, where this phased clock signal is used as the stable reference clock. The phase detection enable signal 64 is provided from the logic control generation block 56 to enable the flip flops 72. Each successive flip-flop 72 captures the next sample of the code in the next clock cycle, including the detection signal bits 66 from all the flip-flops 62 to be used during the error correction and selection procedure described below. For example, 16 flip-flops 72 are shown in FIG. 4-1, which provide 16 samples of the code. Other embodiments can use different numbers of flip-flops 72 (or other suitable components), depending on how many samples are desired.

In the circuit of FIG. 4-2, the detection signals 66 are provided as data input to a first flip-flop 72a as an N-bit code. The output code of the flip-flop 72a is provided as an output code (Phscode0) 74a and the output of the flip-flop 72a is connected to the data input to flip-flop 72b, which has an output (Phscode1) 74b and is connected to the data input of the next flip-flop 72, and so on for all the flip-flops 72. Each flip-flop 72 thus captures another clock cycle's detection signal code, providing another sample.

FIG. 4-3 is a schematic diagram illustrating one embodiment 80 of the error correction block 44 and the aligned phase selection block 54 of FIG. 3. The circuit 80 includes code selection logic 82, which can, in some embodiments, perform the functions of error correction block 44 as well as the aligned selection block 54. In other embodiments, these functions can be separated into different logic or other components. The code selection logic 82 receives the code samples 74 from the capture circuit 70 of the detection and capture block 52, where each bit position of the code samples 74 is associated with a different one of the phased clock signals 14. The code selection logic 82 also receives an enable signal (Phsdet_enB) 84 from the logic control generation block 56 to enable the selection of a clock signal. In some embodiments, the enable signal 84 is the complement of enable signal 64, to enable the code selection logic 82 in sequence after the enabling of detection circuit 60 and capture circuit 70. Validation and error correction is first performed on the received codes 74 as part of error correction block 44, which provides one or more error-corrected codes used for selection. The code selection logic 82 then selects the bit position of the code representing the phased clock signal that is closest to the incoming clock signal. The closest phased clock signal is selected based on applying a particular selection method used by the code selection logic 82, as described in greater detail below with respect to FIGS. 6-1 and 6-2.

Figure 43:
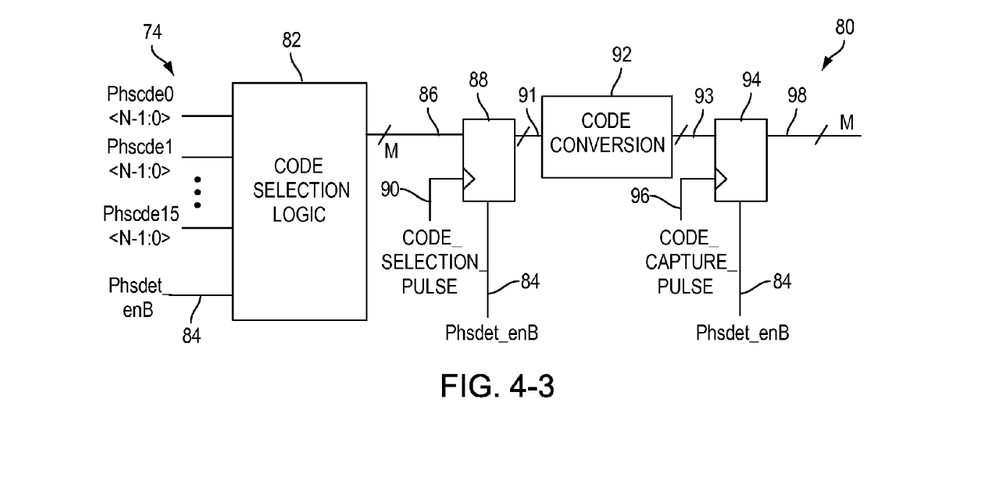

The code selection logic 82 outputs a selection signal 86 that indicates which of the phased clock signals 14 has been selected as the most aligned clock signal. In some embodiments, the output signal 86 can be a code output on a multiple-bit bus that indicates which of the phased clock signals 14 has been selected. For example, in the embodiment of FIG. 4-3, the output bus has M bits, where M is a portion of the number of bits used in the data bus of the system. In some embodiments, the selection code 86 can be provided to the data input of a flip-flop 88. Flip-flop 88 receives a clock input of a code selection pulse signal 90 and enable signal 84 provided by the logic block 56, where the code selection pulse signal 90 clocks the selection code on output bus 91 according to timing requirements known by the logic block 56.

In some embodiments, a code conversion block 92 can be provided to receive the M-bit bus 91 and convert the received code to a code that indicates one of the other phased clock signals 14 that meets any particular application or predetermined system requirements. For example, if the system requires a clock signal that is slightly delayed from the incoming clock signal 12 (e.g., by a particular number of unit intervals), and the code on bus 91 indicates that the Phs<5> clock signal 14 is most aligned, then the block 92 can convert the code to a code indicating that one of the clock signals 14 delayed from Phs<5> by the desired amount is to be selected as the output clock, such as the Phs<6> clock signal.

In some embodiments, another flip-flop 94 receives the output from the code conversion block 92 on bus 93 (or receives the output on bus 91) as its data input. Flip-flop 94 also receives a clock input of a code capture pulse signal 96 and enable signal 84 provided by the logic block 56. The code capture pulse signal 96 clocks the M-bit selection code on output bus 98 according to timing requirements known by the logic block 56. The use of the two flip-flops 88 and 94 to latch the code allows a reduction in probability of metastability issues (e.g., violation of the setup and hold times of flip-flops) and resulting random errors that may occur in the output selection code.

The selection signal output by the code selection logic 82, and/or the output selection code on bus 98, can be provided to a multiplexer 48 (see FIG. 1) or other circuit that selects and outputs the indicated phased clock signal 14.

Figure 5:
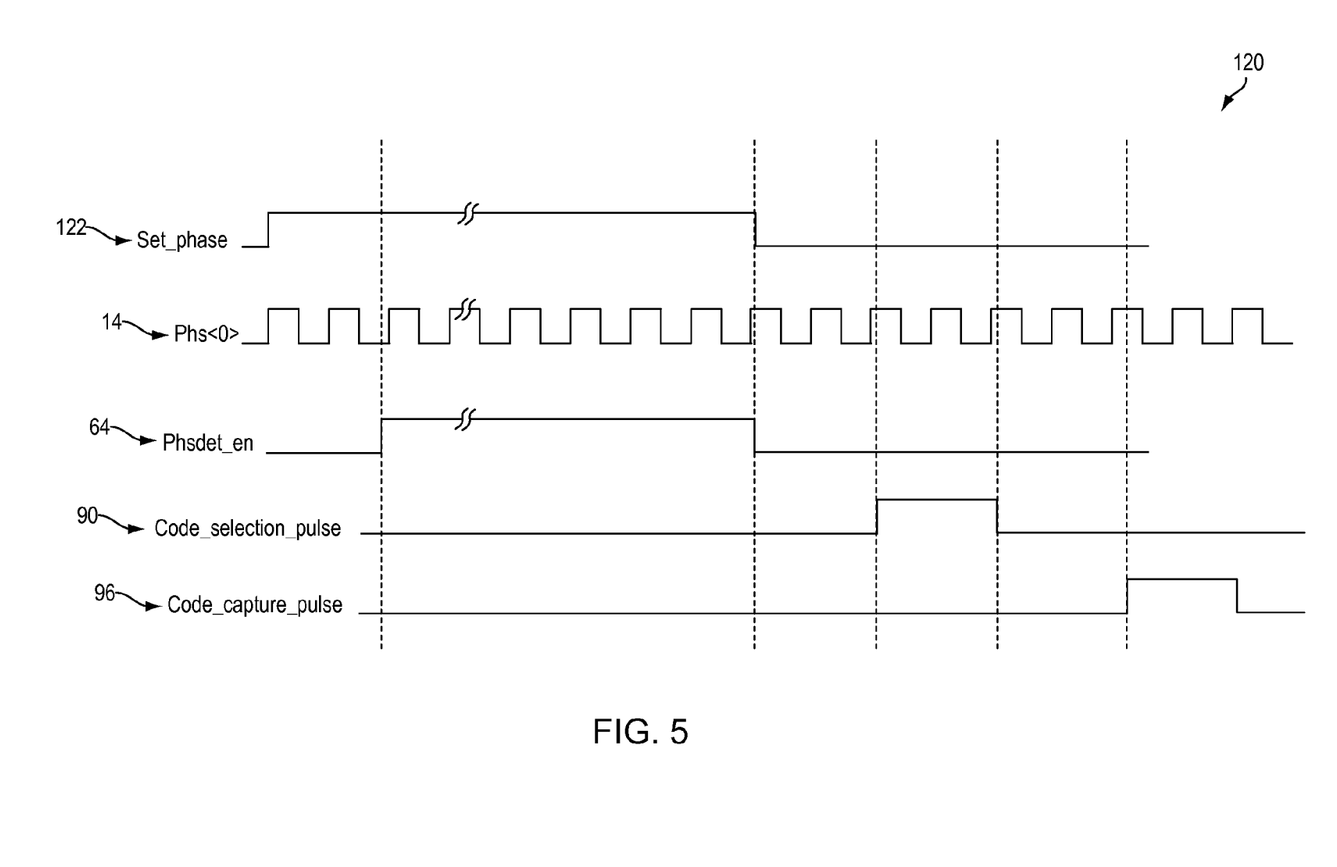
FIG. 5 is a timing diagram illustrating control signals for use in some embodiments described herein.

FIG. 5 is a timing diagram 120 illustrating control signals for use in some embodiments described herein. A set phase signal 122 can be provided by the logic block 56 to enable the operation mode (signal detection and alignment) of the circuit 10, and is started before the other enable signals shown in FIG. 5. The Phase 0 (Phs<0>) signal 14 is the reference clock signal used in embodiments described herein. The phase detection enable signal (Phsdet_en) 64 is asserted after the set phase signal 122 has been asserted, to allow the phase detection, capture, and aligned signal selection, and has a duration based on the number of clock cycles needed to detection and capture the samples of codes 74 and to select the most aligned clock signal. For example, in some embodiments the phase detection enable signal 64 can be asserted for 20 or more (e.g., 40) clock cycles.

In some embodiments, the pulses 90 and 96 can be used. The code selection pulse 90 is provided to the clock input of the flip-flop 88 at the output of the code selection logic 82, as shown in FIG. 4-3. The pulse 90 is asserted after the phase detection enable signal 64 by a predetermined number of clock cycles that allows the flip-flop 88 to clock the selection code at the appropriate time. For example, in some embodiments the pulse 90 can be asserted (e.g., a rising edge can be provided) about two clock cycles after the phase detection enable signal 64. Similarly, the code capture pulse 96 is provided to the clock input of flip-flop 94 at the output of the flip-flop 88 as shown in FIG. 4-3. The pulse 96 is asserted after the code selection pulse 90 by a predetermined number of clock cycles that allows the flip-flop 94 to clock the selection code at the appropriate time. For example, in some embodiments the pulse 96 can be asserted (e.g., a rising edge can be provided) about two clock cycles after the code selection pulse 90. The use of the pulses 90 and 96 instead of the selected clock signal to clock the flip-flops 88 and 94 is useful, for example, in high-speed embodiments in which the clock signal has too high a frequency (i.e., pulses of too short a duration) to allow adequate setup and hold times of the flip-flops. The longer duration of the pulses 90 and 96 allows the setup and hold times to be met, and reduces metastability occurrences. In alternate embodiments, high-performance, high-speed flip-flop(s) with appropriate low setup and hold times can be used with a high-speed selected phased clock signal input as the clock input to the flip-flops.

Figure 61:
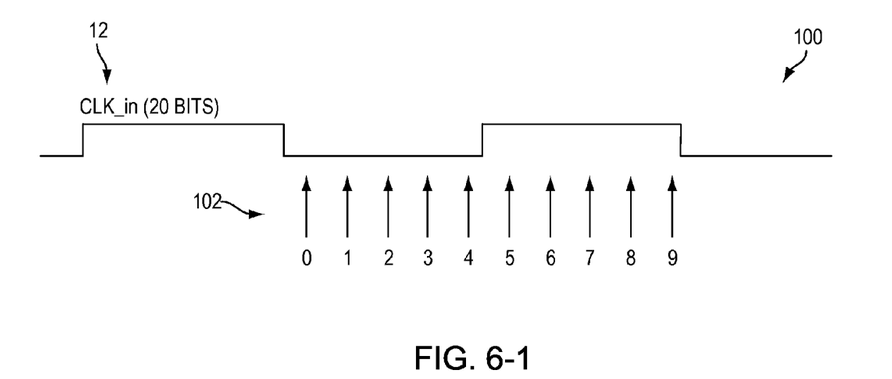
Figure 62:
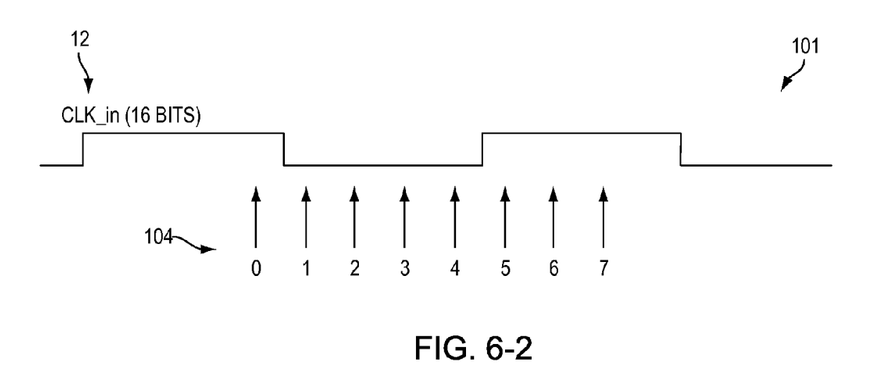

FIGS. 6-1 and 6-2 are diagrammatic illustrations 100 and 101 of example embodiments of error correction in the detection signals from the detection circuit and selection of a phased clock signal 14 that is aligned with the incoming clock signal 12.

As shown and described in connection with FIG. 4-3, the error correction block 44 receives one or more samples 74 of the sampled bit code provided by the capture circuit 70, and performs validation and error correction to one or more of the codes. Jitter and injection noise, for example, can distort the clock signal 12 at random or unknown times, so that accurately represented clock signals may not have been detected nor accurate clock information captured. Thus, the error correction attempts to correct any bits in the sampled code(s) that appear to represent such noise or distortion.

The diagram of FIG. 6-1 illustrates the incoming clock signal 12 in comparison with the rising edges 102 of the different phased clock signals 14, where the incoming clock signal 12 level or state (0 or 1) is the signal (bit) detected at each of the rising edges 102. In the example of FIG. 6-1, the clock signals are used in a system having a 20-bit bus. Therefore, ten different phased clock signals are used, each phased clock signal being represented by a different bit position 0-9 in the detected 10-bit code. For example, the phase 9 signal bit can be treated as being one phase (i.e., one interval between the phased clock signals) ahead of the phase 0 signal bit. Other embodiments may use a different number of bits and phased clock signals. For example, FIG. 6-2 illustrates the incoming clock signal 12 and rising edges 104 of the different phased clock signals 14 in a 16-bit system, such that eight different phased clock signals are detected, each phased clock signal being represented by a different bit position 0-7 in the detected 8-bit code.

The method of error correction performed by the error correction block 44 can be one or more of multiple methods. In some embodiments, one of multiple available methods can be selected by the error correction block 44, control logic 56, and/or logic in code selection logic 82. For example, the particular method used can be selected by a user or controller, or selected by logic 44, 56, or 82 after examining predetermined criteria as to which method may be most suitable. In one embodiment, the error correction method can be selected using a signal to the error correction block 44, e.g., a 2-bit control signal allows the selection of one of four different error correction methods.

In one embodiment of an error correction method, the error correction block 44 (or other component) averages multiple code samples to provide a result that has reduced effects from jitter and errors. For example, the code selection logic 82 shown in FIG. 4-3 receives multiple samples of codes 74 from the circuit 70 of FIG. 4-2, and these samples can be averaged by the error correction block 44 to a single error-corrected code, e.g., averaged by taking the most frequent or common bit code of the samples as the result. This approach allows one-time or other infrequent errors in the incoming signal 12 to be significantly reduced when averaged with many more other bit codes not having these errors.

Another method that can be used for the error correction includes bit changing, where a bit that is between two different bits is changed to correspond to the surrounding bits. For example, if the code is 0000110111, then the 7th bit is changed from a 0 to a 1 value, because the 0 is surrounded by 1 bits, resulting in an error-corrected code of 0000111111. This bit-changing method can in some embodiments require that there are multiple consecutive bits of the same value surrounding the changed bit for the change to be performed, e.g., multiple successive 1's in the example.

In another error correction method, the largest run of consecutive 1 bits is kept, while all other bits are changed to 0. For example, if again the code is 0000110111, then the last three 1 bits are kept, and the other bits are changed to 0, resulting in an error-corrected code of 0000000111. In another related error correction method, the largest run of consecutive 0 bits is kept, while all other bits are changed to 1. For example, if again the code is 0000110111, then the first four 0 bits are kept, and the other bits are changed to 1, resulting in an error-corrected code of 0000111111.

Some embodiments can provide the averaging described above (or another error correction method) as the only error correction, while other embodiments can use multiple error correction methods, such as averaging as well as one or more additional error correction methods.

In the described embodiment, the code selection logic 82 selects one of the phased clock signal bits of the code to be the most aligned to the incoming clock signal 12, based on applying a selection method to the bits in the error-corrected code. In some embodiments, the selection of the most aligned clock signal can be performed using the averaged result of the multiple sample codes 74, if that error correction method is being used. In one embodiment, the phased signal that is selected as the most aligned signal corresponds to the first 1 bit of a predetermined number of consecutive 1 bits following a predetermined number of 0 bits in the code. For example, in one embodiment having a 10-bit code, the predetermined number of 1 bits and 0 bits can be at least four. Thus, in the embodiment where the sampling code is 10 bits, the detected code ideally will be 5 consecutive 0 bits followed by 5 consecutive 1 bits, or 0000011111. The most aligned phased clock signal 14 will be the Phs<5> clock signal, the sixth phased clock signal being represented by rising edge 6 in FIG. 6-1 and the 6th bit position in the code. However, due to jitter, duty cycle distortion and the stability of the sampler, the code can include errors. For example, the code may be 0000111111 or 10000(1/0)1111 (the 6th bit being 1 or 0). If the first 1 bit is selected after a number of consecutive 0 bits, and the first 0 bit is selected before a number of consecutive 1 bits, the possible phases to be selected are phases 4, 5, and 6, of which one can be selected as the aligned clock signal (e.g., phase 5).

In other embodiments having a different number of bits in the code, the predetermined number of consecutive 1 or 0 bits can be different, e.g., with an 8-bit code, the predetermined number can be three. In addition, other embodiments with different duty cycle tolerances can look for different predetermined numbers of consecutive bits. For example, in a system having a 40/60 duty cycle tolerance, a 10-bit code can use four bits as the predetermined number of bits, while a system having a 30/70 duty cycle tolerance and 10-bit code can use three bits as the predetermined number of bits.

Furthermore, in some embodiments the selected bit and/or bit code can be compared to other selected bits from one or more of the other received sample codes 74. In one embodiment, there are five consecutive 0 bits followed by five consecutive 1 bits, and these same bits are in each of the received samples. In actual results, some of the samples will have different bits due to introduced noise or interference. For example, the first 1 bit in the string of consecutive 1 bits may be inconsistent among the samples. In this case, this inconsistent bit may be selected as the aligned phased clock, since it occurs very close to the time when the incoming clock's value is changing at the rising edge. If the last 1 bit in a string of 1 bits is inconsistent among the multiple samples, then there are two possibilities: one possibility is that the last 0 bit in the longest string of 0 bits is the closest aligned clock signal, and the other possibility is that the duty cycle of the incoming clock signal 12 is worse than 45%/55%. In this case, the logic can select the last 0 bit. If the last 1 bit in a string of 1 bits is inconsistent and the last 0 bit in a string of consecutive 0 bits is inconsistent, then the last 0 bit can be selected as the closest phased clock signal, since it is at the rising edge of the incoming clock signal.

In some embodiments, if there is a sampled code that has two different longest strings of the same consecutive bits that may meet the required predetermined number, then a different action can be taken, since such codes are not reliable. For example, in a system looking for a predetermined number of three consecutive bits, the code may be 1110001110, in which there are two different strings of consecutive 1 bits both having the longest size. To filter out such unreliable samples, the codes having such multiple strings can be filtered out and an error reported.

The error correction described above allows an aligned clock to be selected and provided based on a single set of samples of the incoming clock, rather than having to wait for many additional cycles and samples. This is advantageous in high-speed systems, which need a clock to be provided in as short a time as possible.

Figure 7:
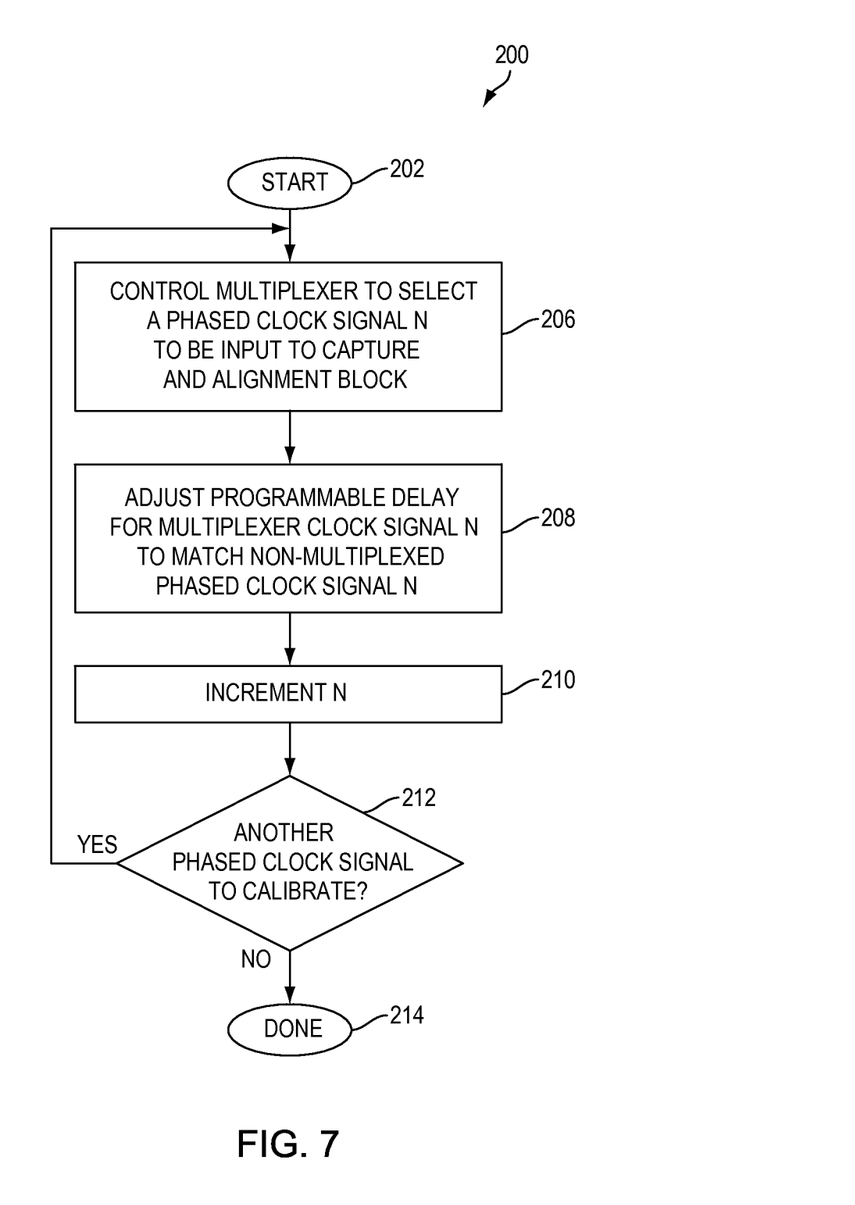
FIG. 7 is a flow diagram illustrating one embodiment of a method for calibrating the clock signal paths in the phase alignment circuit.

FIG. 7 is a flow diagram illustrating one embodiment of a method 200 for calibrating the clock signal paths in the phase alignment circuit 10. Method 200 can be implemented during a calibration mode of the circuit 10, which can be performed before the phase detection and alignment operational mode of the circuit. The method 200 can be implemented by a processor or processing circuit, for example, such as logic circuitry or one or more processors (e.g., microprocessors) within the calibration block 46 of the alignment and calibration block 36, or by different logic in the circuit 10 (see FIG. 1).

The method starts at 202, and in step 206, the multiplexer 20 is controlled to select one of the multiplexer phased clock signals 14, i.e., a phased clock signal of Phase N, to be output from the multiplexer 20, through the programmable delay block 30, and input to the associated flip-flop 62 of the detection circuit 60. For example, in the embodiment of FIG. 1, the calibration block 46 outputs a control signal 22 to the multiplexer 20 to perform this selection. In one example, in the first iteration N equals 1, which in the described example can be the Phs<0> clock signal.

In step 208, the programmable delay of the programmable delay block 30 is adjusted for the particular path of the selected multiplexer phased clock signal N, so that the phased clock signal N through the multiplexer path matches the non-multiplexed phased clock signal N through the delay unit 26 path at the associated flip-flop 62. The delay block 30 path that corresponds to the selected phased clock signal 14 is adjusted. For example, if N is equal to 1 and Phs<0> clock signal is selected through multiplexer 20, then the delay block 30a in FIG. 4-1 is adjusted for the Phs<0> flip-flop 62a. In the example of N equal to 1, the first selected signal is the reference signal, and the associated delay path in delay block 30 is adjusted so that the flip-flop 62 for the reference signal (e.g., flip-flop 62a for the Phs<0> clock signal) catches the rising edge of the multiplexer phased clock signal N. In later iterations where N is greater than 1, the associated delay of delay block 30 for the corresponding phased clock signal N is adjusted to align the multiplexer clock signal N to the non-multiplexed phased clock signal N. This process calibrates and substantially matches the two clock signal paths for each of the flip-flops 62, where the first path is through the multiplexer/delay block 30 and the second path is through the delay unit 26 and the clock tree in the alignment and calibration block 36, such that the paths have the same delay (or substantially the same delay) at the associated flip-flop 62 in the detection circuit 60 of FIG. 4-1.

Thus, when the incoming clock signal 12 later uses the multiplexer path in operation mode, the incoming clock signal path to the data input of each flip-flop 62 (i.e., that path including the multiplexer 20 and delay block 30) is known to match the particular phased clock signal 14 path through the delay unit 26 and clock tree to the clock input of that flip-flop 62, despite any process, voltage, or temperature variations that may have occurred in the circuit.

In step 210, N is incremented. In step 212, the process checks whether there is another clock signal path to calibrate, or all the paths have been calibrated. If all of the paths have been calibrated, the calibration process is complete at 214. If there are more path(s) to calibrate, the process returns to step 206 to select the next phased clock signal N to output from the multiplexer 20 and adjust the associated delay in programmable delay block 30 as needed.

Figure 8:
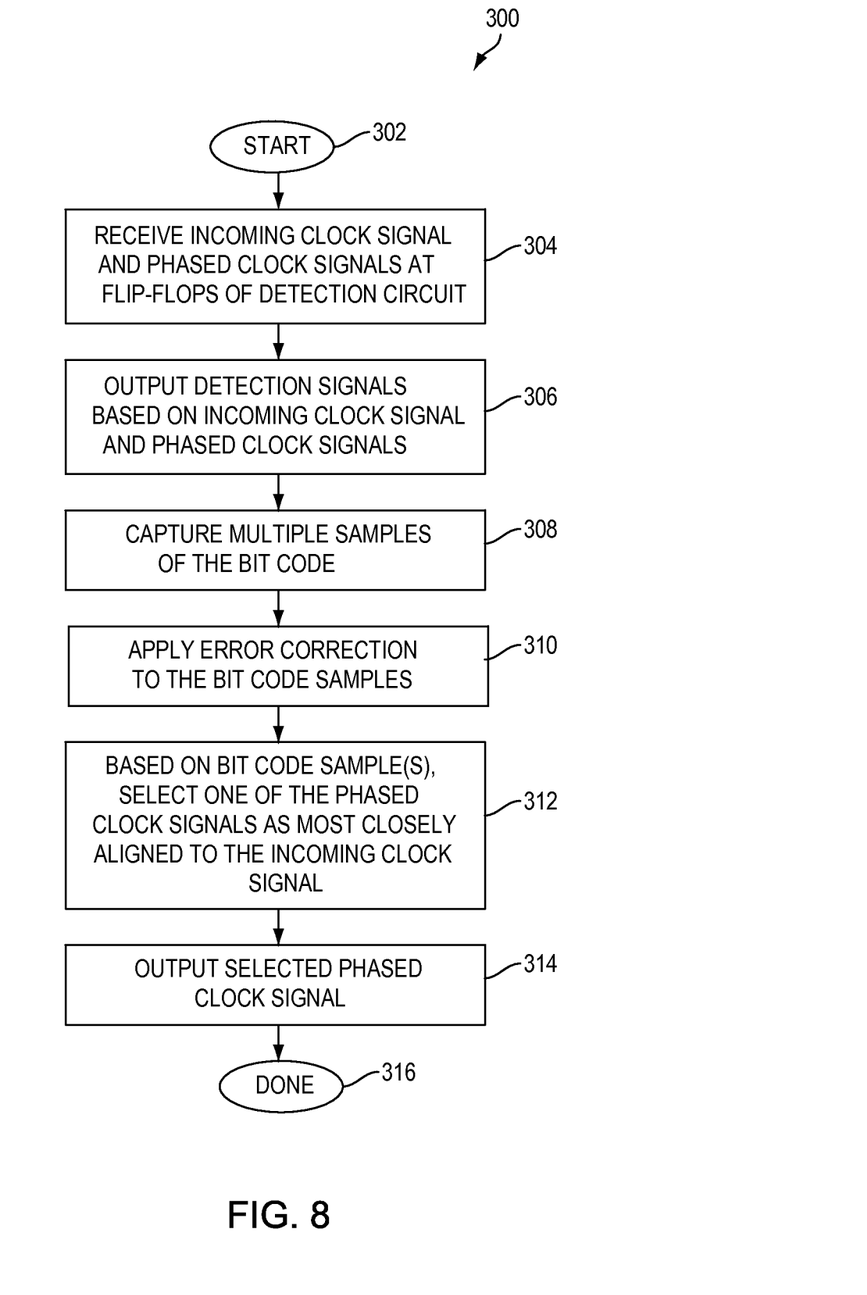
FIG. 8 is a flow diagram illustrating one embodiment of a method for detecting and aligning clock signals.

FIG. 8 is a flow diagram illustrating one embodiment of a method 300 for detecting and aligning clock signals. Method 300 can be performed by processing circuitry, for example, such as logic or one or more processors, in the alignment and calibration block 36 (e.g., in the code selection logic 82) or by other component(s) of the circuit in other embodiments.

The method begins at 302, and in step 304, the incoming clock signal 12 is received by the flip-flops 62 of the detection circuit 60 via the multiplexer 20 path, and the phased clock signals 14 are received via the delay unit 26 path. In step 306, the detection circuit 60 outputs detection signals 66 based on the incoming clock signal and the phased clock signals. For example, in the embodiment of FIG. 4-1, each detection signal 66 is a sample of the incoming clock as clocked by the rising edges of a different one of the phased clock signals 14. In some embodiments, the detection signals 66 can collectively be provided as a bit code including each of the signals 66 as a bit.

In step 308, multiple samples of signals 66 are captured by the capture circuit 70, e.g., multiple samples of the bit code representing signals 66. In step 310, error correction is applied by the error correction block 44 to one or more of the bit code samples 74 output by the capture circuit 70. For example, the multiple bit code samples can be averaged, and additional error correction can be applied to the averaged bit code. In step 312, one of the phased clock signals 14 is selected as the most closely aligned to the incoming clock signal based on the bit code sample(s). As described above, in some embodiments the most closely aligned phased clock signal corresponds to the first 1 bit position of a string of 1 bits in the error-corrected bit code after a string of 0 bits, indicating that the associated phased clock signal has a rising edge most closely aligned to the rising edge of the incoming clock signal. The code selection logic 82 can perform the selection and output a selection signal or code indicating the selection, where in some embodiments the selection code and/or portions thereof can be clocked at particular times based on system requirements.

In step 314, the selected phased clock signal 14 is output from the circuit as the aligned clock signal. In some embodiments, this output clock is provided from circuitry such as a multiplexer 48 based on the selection signal from the code selection logic, or can be output from the alignment and calibration block 36. The process is then complete at 316.

In other embodiments, a different clock signal may be desired to be selected for output that does not have an aligned phase with the incoming clock signal. For example, the output clock may be desired to be aligned to a different predetermined phase from the phase of the incoming clock signal, such that a different bit position of the bit code is selected which corresponds to the desired output clock phase. Code conversion block 92 can, for example, be used to select a different phased clock signal as the desired output clock signal that meets system requirements.

The embodiments herein allow more accurate and robust aligned signal selection from multiple phases of clock signals. Embodiments described herein can reduce the inaccurate detection of a clock due to injected noise or interference, allowing more accurate clock alignment within a fast response time. Embodiments may also use calibration to reduce the inaccuracies introduced by process, voltage, and temperature variation in the detection and alignment circuits.

Although the present invention has been described in accordance with the embodiments shown, one of ordinary skill in the art will readily recognize that there could be variations to the embodiments, and those variations would be within the spirit and scope of the present invention. Accordingly, many modifications may be made by one of ordinary skill in the art without departing from the spirit and scope of the appended claims.

What is claimed is:

1. A method, comprising:
receiving an incoming clock signal and a plurality of phased clock signals, each of the phased clock signals having a different phase and a substantially same phase offset from one other of the phased clock signals;
calibrating the signal paths of the incoming clock signal and the phased clock signals by adjusting independently-programmable delays in the signal paths of the incoming clock signal for each of the phased clock signals such that the incoming clock signal arrives at a respective one of a plurality of detection flip-flops at substantially the same time as a corresponding one of the phased clock signals;
providing at least one detection signal based on the incoming clock signal and the phased clock signals;
correcting one or more errors in the at least one detection signal contributed by noise in at least the incoming clock signal; and
based on the at least one detection signal, selecting one of the phased clock signals as the most closely aligned of the phased clock signals to the predetermined clock phase, wherein the selected phased clock signal is output as the aligned output clock signal.

2. The method of claim 1, wherein the selected phased clock signal has a phase aligned with a phase of the incoming clock signal.

3. The method of claim 2, wherein a detection circuit receives the incoming clock signal and provides the at least one detection signal as a plurality of bits in a bit code.

4. The method of claim 3, wherein each of the detection flip-flops is configured to:
receive the incoming clock signal as a data input,
receive a different one of the phased clock signals as a clock input, and
provide one of the detection signals indicating a state of the incoming clock signal at a rising edge of the received phased clock signal.

5. The method of claim 3, further comprising a capture circuit receiving the detection signals and capturing a plurality of samples of the detection signals using the plurality of flip-flops.

6. The method of claim 2, wherein:
the selecting one of the phased clock signals includes examining the detection signals provided as a bit code having each bit position representing one of the detection signals; and
the selected phased clock signal is selected based on applying a selection method to the bit code.

7. The method of claim 6, wherein:
the selecting includes searching the bit code for a predetermined number of consecutive 1 bits following a predetermined number of consecutive 0 bits; and
the first of the consecutive 1 bits corresponds to the selected phased clock signal.

8. The method of claim 5, wherein the correcting one or more errors includes averaging the plurality of samples, each sample taken from a different clock cycle.

9. The method of claim 6, wherein the correcting one or more errors includes at least one of:
changing a bit value in the bit code which is surrounded by different bit values in the bit code; or
keeping a longest string of consecutive bits having the same value in the bit code and changing all the other bits in the bit code to a different value.

10. The method of claim 5, wherein:
control logic outputs at least one enable signal to enable the operation of the detection circuit, the capture circuit, and selection logic; and
the selected phased clock signal is output based on at least one control signal provided by the control logic at a particular time after the selection of the selected phased clock signal.

11. A method, comprising:
receiving an incoming clock signal and a plurality of phased clock signals, each of the phased clock signals having a different phase and a substantially same phase offset from one other of the phased clock signals;

calibrating the signal paths of the incoming clock signal and the phased clock signals by adjusting a delay in the signal path of the incoming clock signal such that the incoming clock signal arrives at a detection circuit at substantially the same time as each of the phased clock signals;

wherein the adjusting the delay includes controlling a programmable delay block in the signal path of the incoming clock signal, the programmable delay block receiving the output of a multiplexer;

selecting one of the phased clock signals that has a phase closest to the particular clock phase, wherein the selected phased clock signal is output as the aligned output clock signal;

receiving by a detection circuit the incoming clock signal from the programmable delay block and providing at least one detection signal used in the selection of one of the phased clock signals; and wherein the programmable delay block provides an independently-programmable delay for each of the phased clock signals, and wherein the detection circuit includes a plurality of detection flip-flops, each of the detection flip-flops being connected to a different one of the independently-programmed delays provided by the programmable delay block.

12. The method of claim 11, wherein the selected phased clock signal has a phase aligned with a phase of the incoming clock signal.

13. The method of claim 12, wherein the calibrating includes:

providing the phased clock signals and the incoming clock signal as inputs to the multiplexer in the signal path of the incoming signal; and selecting each of the phased clock signals in turn for calibration with signal paths of the phased clock signals.

14. A clock alignment circuit, comprising:

a detection circuit receiving an incoming clock signal and a plurality of phased clock signals, each of the phased clock signals having a different phase and a substantially same phase offset from one other of the phased clock signals;

wherein the detection circuit provides at least one detection signal based on the incoming clock signal and the phased clock signals;

wherein the detection circuit includes a plurality of detection flip-flops, each of the detection flip-flops configured to:
  receive the incoming clock signal as a data input,
  receive a respective one of the phased clock signals as a clock input, and
  provide the at least one detection signal indicating a state of the incoming clock signal at a rising edge of the received phased clock signal;

a plurality of independently-programmable delays in signal paths of the incoming clock signal to the detection flip-flops, respectively;

calibration logic coupled to the independently-programmable delays and configured to adjust each independently-programmable delay such that the incoming clock signal arrives at each detection flip-flop at substantially the same time as the respective phased clock signal;

selection logic receiving the at least one detection signal from the detection circuit;

wherein the selection logic corrects one or more errors in the at least one detection signal contributed by noise in at least the incoming clock signal and, based on the at least one detection signal, selects one of the phased clock signals as the most closely aligned of the phased clock signals to a particular clock phase; and wherein the selected phased clock signal is output as an aligned output clock signal.

15. The clock alignment circuit of claim 14, wherein:

the at least one detection signal is a plurality of detection signals;

the detection circuit provides the detection signals as a plurality of bits in a bit code.

* * * * *